United States Patent [19]
Stephens, Jr. et al.

[11] Patent Number: 5,550,783
[45] Date of Patent: Aug. 27, 1996

[54] PHASE SHIFT CORRECTION CIRCUIT FOR MONOLITHIC RANDOM ACCESS MEMORY

[75] Inventors: Michael C. Stephens, Jr.; Ajit K. Medhekar, both of San Jose, Calif.

[73] Assignee: Alliance Semiconductor Corporation, San Jose, Calif.

[21] Appl. No.: 424,820

[22] Filed: Apr. 19, 1995

[51] Int. Cl.$^6$ ............................................. G11C 8/00
[52] U.S. Cl. ............... 365/233; 365/189.07; 365/194; 327/158; 327/277
[58] Field of Search ........................... 365/233, 194, 365/189.07; 327/155, 156, 158, 277

[56] References Cited

U.S. PATENT DOCUMENTS

| | | | |
|---|---|---|---|
| 4,970,693 | 11/1990 | Nozaki et al. | 365/233 |
| 5,440,514 | 8/1995 | Flannagan et al. | 365/194 |
| 5,440,515 | 8/1995 | Chang et al. | 365/194 |
| 5,444,667 | 8/1995 | Obara | 365/233 |

*Primary Examiner*—Son Dinh
*Attorney, Agent, or Firm*—Bradley T. Sako

[57] ABSTRACT

A synchronous burst SRAM (110) is disclosed that includes a clock circuit (112) having a phase correction subcircuit (134) and a clock routing subcircuit (132). The clock routing subcircuit (132) provides an internal clock signal to at least one clocked circuit. The phase correction subcircuit (134) is a modified phase locked loop that includes a phase comparator (138) that receives an external clock signal and a delayed internal clock signal. In response to the signals, the phase comparator (138) provides a phase error signal to a charge pump (140) which is coupled to a loop filter (142) to provide an error voltage. The error voltage is coupled to a VCO (144) which provides the internal clock signal as an output. The internal clock signal is coupled to the input of the phase comparator (138) by a feedback circuit which generates the delayed internal clock signal for the phase comparator (138). The feedback circuit can include a number of delay elements (146) to simulate the clock delay inherent in the clock routing subcircuit (132) so that the resulting internal clock signal is phase shifted to compensate for delays caused by the clock routing subcircuit (132).

18 Claims, 5 Drawing Sheets

5,550,783

PHASE SHIFT CORRECTION CIRCUIT FOR MONOLITHIC RANDOM ACCESS MEMORY

TECHNICAL FIELD

The present invention relates generally to high density random access memory (RAM) semiconductor circuits, and more particularly to clock circuits therefor.

BACKGROUND OF THE INVENTION

Synchronous random access memories (RAMs) are commonly employed in computer systems to operate as cache RAM for a microprocessor. Synchronous RAMs (usually static RAMs or SRAMs) operate according to the timing provided by a system clock. For example, read operations begin with an address being latched on a first clock cycle. Once the address is latched, row and column decoding functions are performed and data are presented to at an input/output (I/O) latch where they are latched on a subsequent clock cycle. Other synchronous functions include "burst" modes wherein, according to control inputs provided, a range of column addresses can be generated on every clock cycle following the initial latching of the address. To accomplish synchronous operation, the system clock is received by the RAM device and distributed to various circuits within, such as the address latch and I/O latch described above.

While synchronous memories provide many advantages, increasing clock speeds and advances in fabrication technology can adversely affect synchronous memory operation. As is well known in the art, long-distance interconnects and delays due to reduced geometry active devices can contribute to overall delay in the propagation of signals within a memory device. Such delays are always present between the point at which the clock signal is received and the point at which the clock signal is applied, and result in a phase shift between certain portions the memory device and the actual system clock. As semiconductor chips get larger with increased integration, and operating frequencies get higher, the percentage of the clock cycle lost to delays increases. Such a phase shift, if severe enough, results in timing errors as portions of the memory device are no longer synchronous with the rest of the system.

A prior art example of an internal clock timing arrangement is set forth in FIG. 1a. The example illustrates, in block diagram form, the timing scheme for synchronous burst SRAM 10. The SRAM 10 includes a clock routing circuit 12, an address latch 14, an X-Y decoding section 16, a burst counter 18, an I/O latch 20, an I/O buffer 22, and an output pad 24. The clock routing circuit 12 receives an external clock ($CLK_{EX}$) and drives the address latch 14, the burst counter 18, and the I/O latch 20. For the example in FIG. 1a, a delay element ($\delta$) is shown between the external clock input and the I/O latch 20 that is representative of the propagation delay or skew therebetween. The delay results in a delayed clock signal ($CLK_{I/O}$) being received at the input of the I/O latch 20.

Set forth in FIGS. 1b and 1c are two timing diagrams illustrating the timing signals of $CLK_{EX}$, $CLK_{I/O}$, and the output data (shown as Dout) for the SRAM 10 of FIG. 1a. The SRAM 10 of FIG. 1a is synchronous with the rising clock edge of $CLK_{EX}$ and the total delay introduced into $CLK_{I/O}$ is shown as "td". If the size of the delay td is too great, timing errors can occur. For example, it is known in the prior art to latch a memory address on a first clock edge and then internally latch the corresponding output data on the following internal clock edge. After a time tz, the output data will be available for sampling at the output on a third clock edge. In order for proper sampling of the output data to occur the output data must have a sufficient setup time prior to the third external clock edge, "ts", and a sufficient hold time, "th", after the third external clock edge. FIG. 1b illustrates an example where td is small enough that the output data have a sufficient setup time. In contrast, FIG. 1c illustrates an example where td is large enough that the output data have an insufficient setup time.

While FIGS. 1a–1c set forth an example of a delay between the external clock and the latching clock signal at the input to the I/O latch, it is understood that similar delays can occur for other clocked portions of the RAM. For example, an unwanted delay between the external clock input and the input to the address latch would shift the actual address latching point. As a result, the address may not have an adequate hold time to be valid.

Clock skew is commonly reduced by efficient layout designs that minimize long-distance interconnects carrying clock signals. U.S. Pat. No. 5,367,490 issued to Akimoto et al. on Nov. 22, 1994 illustrates an SRAM design with an advantageous layout, as well as an apparatus for providing a read pulse with a variable delay and duration to maximize timing efficiency.

Other specialized synchronous memory architectures, such as "pipeline" designs provide increased performance, but are still limited by the propagation delay of the clock circuits therein.

Other memory designs, unrelated to synchronous RAMs, have addressed variable data signals with phase locked loop designs. For example, a phase locked input port for the reception of asynchronous serial data in a two-port RAM is set forth in U.S. Pat. No. 5,260,909 issued to David Davidian on Nov. 9, 1993.

While a number of approaches to improving clock performance in semiconductor devices exist in the prior art, these approaches all have limitations as to the amount of improvement they can provide. Thus it is desirable to provide a circuit to improve clock performance beyond the methods described above.

SUMMARY OF THE INVENTION

It is an object of the present invention to provide a clock circuit that compensates for delays between an external clock signal and clock controlled circuits within a synchronous memory device.

According to the present invention a synchronous monolithic memory device includes a clock circuit for distributing an internal clock signal to at least one clock controlled circuit within the memory device. The clock circuit includes a phase correction subcircuit and a clock routing subcircuit. The phase correction circuit includes a modified phase locked loop (PLL) with a delay feedback element. The modified PLL provides an internal clock signal that is derived from an external clock input and a feedback input. The internal clock signal is phase shifted to compensate for the delays introduced by the clock routing subcircuit.

According to one aspect of the invention the feedback signal is the internal clock signal tapped from a midway point on the clock routing subcircuit.

According to another aspect of the invention the feedback signal is a feedback loop from the internal clock output to the feedback input. The feedback loop includes a delay element analogous to the clock routing subcircuit between the output of the modified PLL and a selected clock controlled circuit within the memory device.

Other objects and advantages of the invention will become apparent in light of the following description thereof.

DETAILED DESCRIPTION OF THE EMBODIMENTS

Figure 1A:
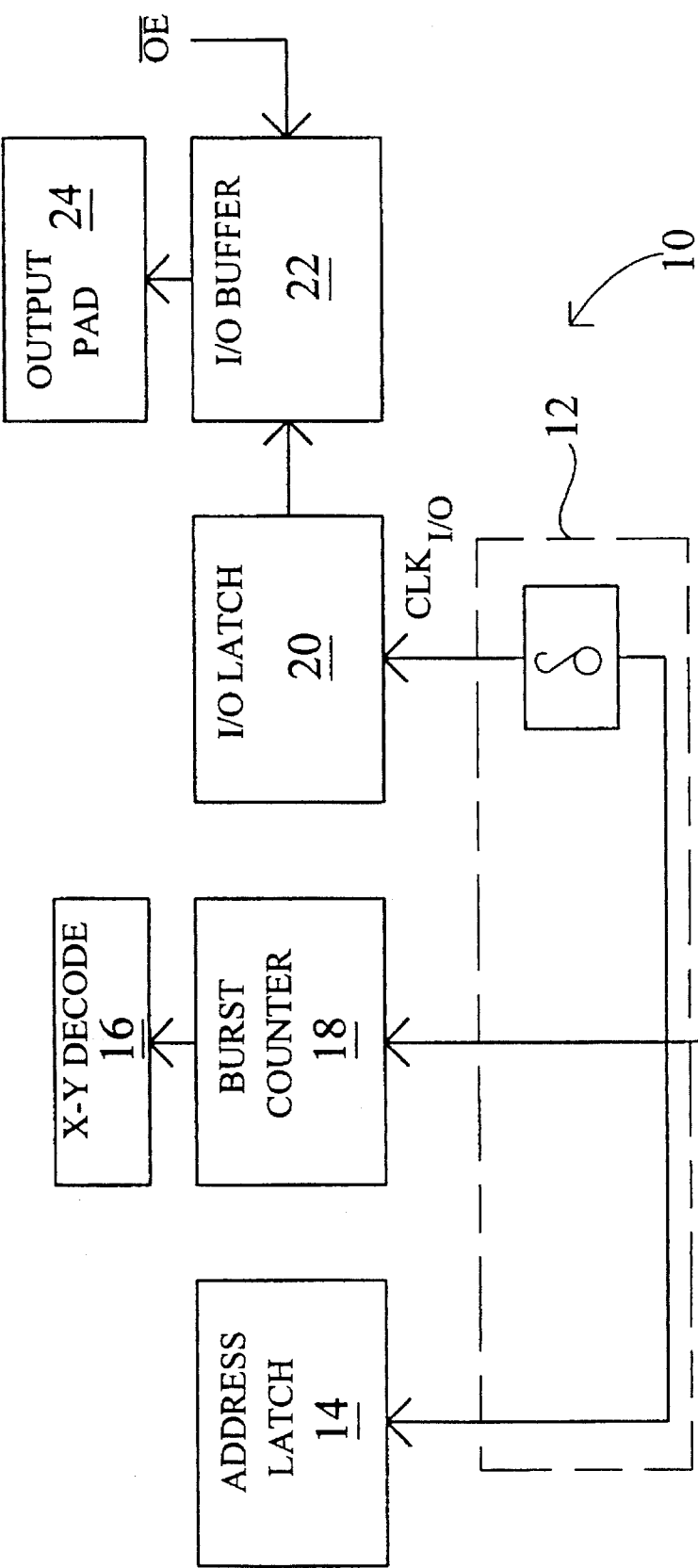
FIG. 1a is a block diagram illustrating the timing circuit of a prior art synchronous burst SRAM.
Figure 1B:
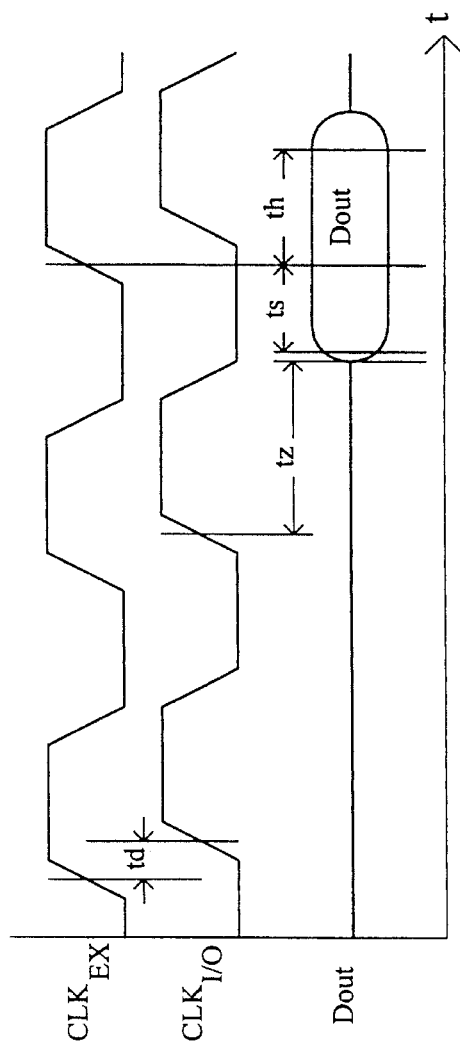
FIG. 1b is a timing diagram illustrating the signals of the prior art SRAM wherein no timing errors occur.
Figure 1C:
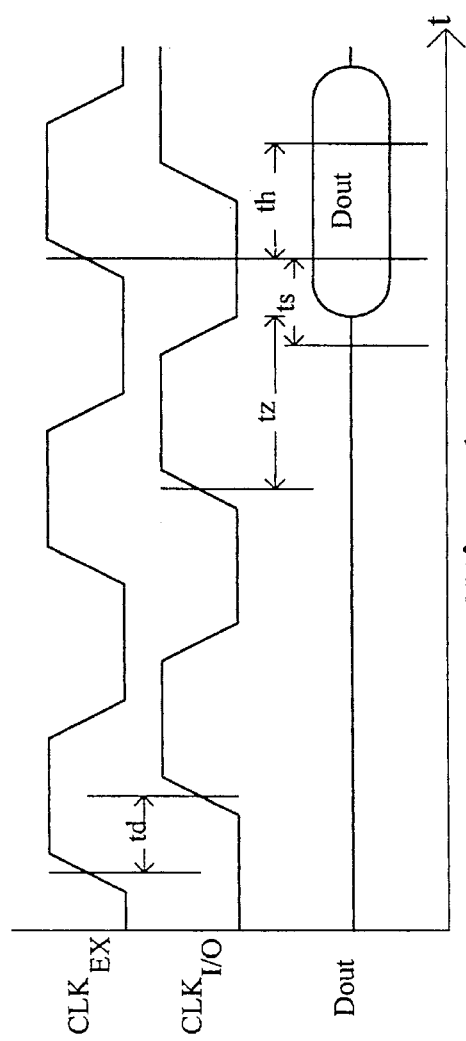
FIG. 1c is a timing diagram illustrating the signals of the prior art SRAM wherein the delay introduced by the clock routing circuit results in a timing error.
Figure 2:
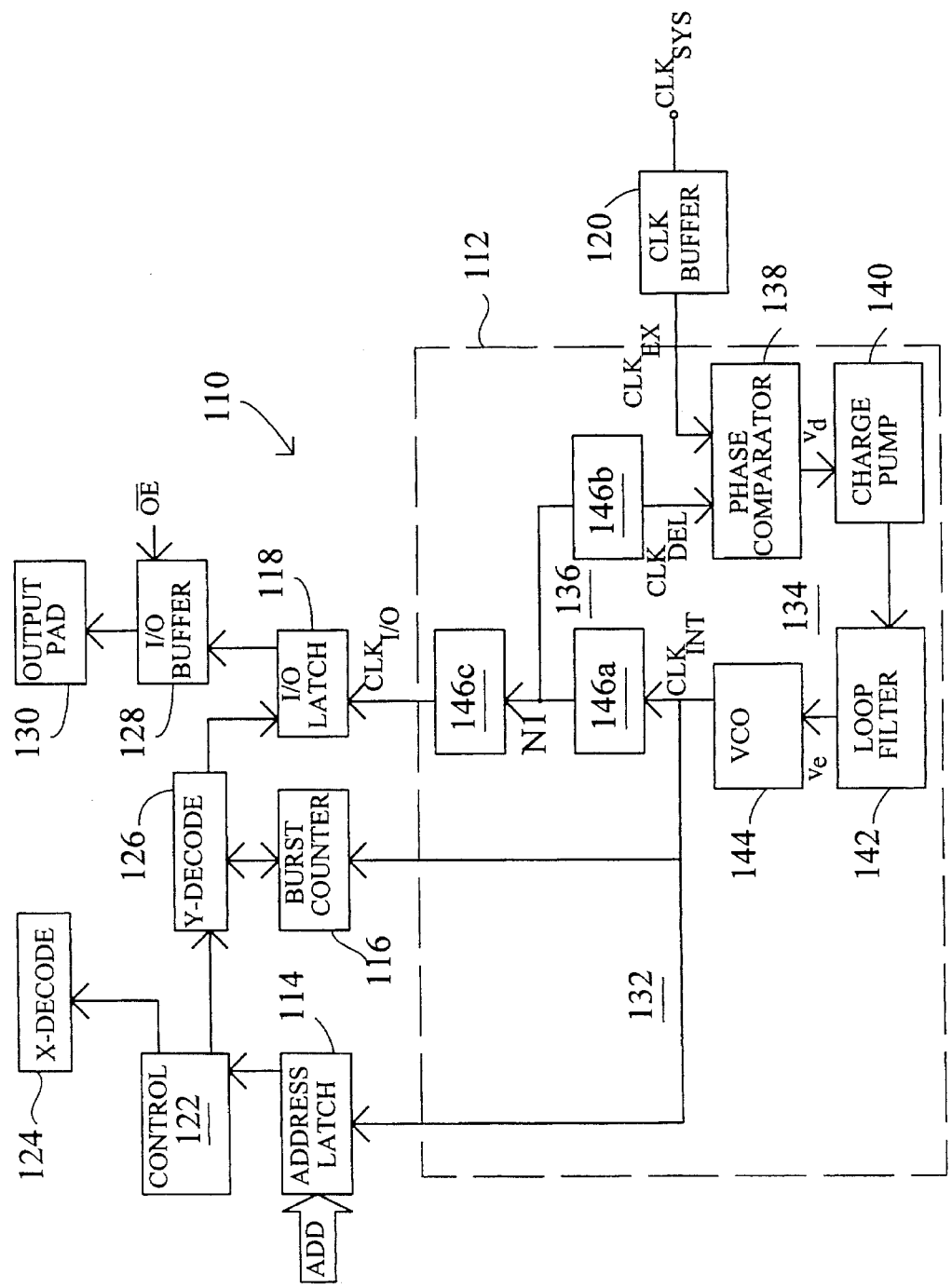
FIG. 2 is a block diagram illustrating an embodiment of the present invention.

FIG. 2 illustrates, generally, a synchronous burst SRAM 110 according to the present invention. The synchronous burst SRAM 110 includes a clock circuit 112 that is coupled to an address latch circuit 114, a burst counter circuit 116, an I/O latch circuit 118, and a clock buffer circuit 120. In the preferred embodiment, the address latch circuit 114 is connected to a control circuit 122 which controls an X-decoder 124 and Y-decoder 126. The Y-decoder 126 provides an output to the I/O latch circuit 118. The I/O latch circuit 118 is connected to an I/O buffer 128 which provides a signal to an output pad 130.

The synchronous SRAM 110 receives a number of externally provided signals. As shown in FIG. 2, the address latch circuit 114 receives an address (shown as ADD), the I/O buffer 128 receives an output enable signal (shown as OE), and the clock buffer circuit 120 receives a system clock signal (shown as $CLK_{SYS}$).

The clock circuit 112 includes a clock routing subcircuit 132 and a phase correction subcircuit 134. As illustrated in FIG. 2, the two subcircuits (132 and 134) overlap at a delay subcircuit 136. The phase correction subcircuit 134 is essentially a phase locked loop (PLL) with the delay subcircuit 136 functioning as a feedback element. The phase correction subcircuit 134 of the embodiment is shown to include a phase comparator 138 which receives two inputs. The first input is the $CLK_{EX}$ signal from the clock buffer circuit 120. The second input is a feedback input that is a delayed clock signal ($CLK_{DEL}$). The phase comparator 138 output is connected to a charge pump 140 which is coupled to a loop filter 142. The loop filter 142 provides an output to a voltage controlled oscillator (VCO) 144. The VCO 144 outputs an internal clock signal (shown as $CLK_{INT}$). The $CLK_{INT}$ signal is used to clock the address latch circuit 114, burst counter 116 and the I/O latch circuit 118. $CLK_{INT}$ appears at the input to the I/O latch circuit 118 as $CLK_{I/O}$.

In the embodiment of FIG. 2, the phase correction subcircuit 134 includes a feedback path from the VCO 144 output to the input of the phase comparator 138. Within the feedback path is a first delay element 146a and a second delay element 146b. A third delay element 146c is disposed between the first delay element 146a and the input to the I/O latch circuit 118. The delay elements 146a and 146c are representative of the delay and skew inherent in the physical layout of the clock circuit 112 on the integrated circuit die. The first delay element 146a is the delay and/or skew caused by the propagation of the $CLK_{INT}$ signal from the output of the VCO 144 to a feedback node N1. The second delay element 146b is representative of the delay and/or skew resulting from feeding the $CLK_{INT}$ signal from node N1 back to the phase comparator 138. The third delay element 146c is the delay and/or skew caused by the propagation of $CLK_{INT}$ from node N1 to the I/O latch circuit 118. Delay element 146b is fabricated to be an approximate equivalent of 146c, i.e. the delay and/or skew caused by 146b is equivalent to the delay/skew of 146c. In this manner the clock signal received at the input to the phase comparator 138 has the same delay and skew as that received at the I/O latch circuit 118.

In operation, $CLK_{SYS}$ is received by clock buffer circuit 120 which outputs the $CLK_{EX}$ signal. $CLK_{EX}$ and $CLK_{DEL}$ are received by the phase comparator 138. In the preferred embodiment, the phase comparator 138 is a sequential phase comparator of CMOS design. As is well known in the art, the phase comparator 138 provides a pulse output with an average differential voltage (vd) that is negative if $CLK_{DEL}$ lags $CLK_{EX}$, or positive is if $CLK_{DEL}$ leads $CLK_{EX}$. The pulse output is applied to the charge pump 140. The charge pump 140 is coupled to the loop filter 142 which provides an error voltage (ve) output. The error voltage is received by the VCO 144 which will increase or decrease its output signal ($CLK_{INT}$) according to ve. Initially, the delay/skew introduced by the first and second delay elements (146a and 146b) will result in $CLK_{DEL}$ lagging $CLK_{EX}$. The phase correction subcircuit 134 compensates for the delay/skew by increasing the frequency of the $CLK_{INT}$ signal at the VCO 144 output so that $CLK_{INT}$ leads the $CLK_{EX}$ signal going into the delay elements (146a and 146b). When $CLK_{DEL}$ is in phase with the $CLK_{EX}$ at the input to the phase comparator 138 the phase correction subcircuit 134 functions as a PLL in lock. Because the second and third delay elements (146b and 146c) are designed to have the same phase delay/skew effect on a clock signal, the $CLK_{INT}$ as received by the I/O latch circuit 118 ($CLK_{I/O}$) is also in phase with $CLK_{EX}$.

Figure 3B:
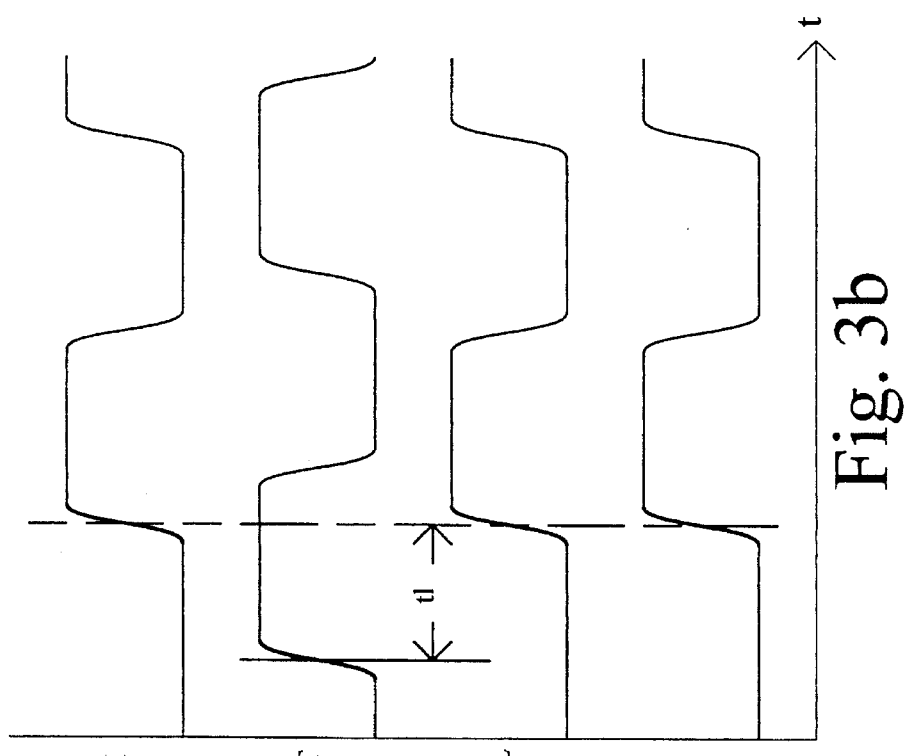
FIG. 3b is a timing diagram illustrating the clock signals of an embodiment of the present invention after phase correction.
Figure 3A:
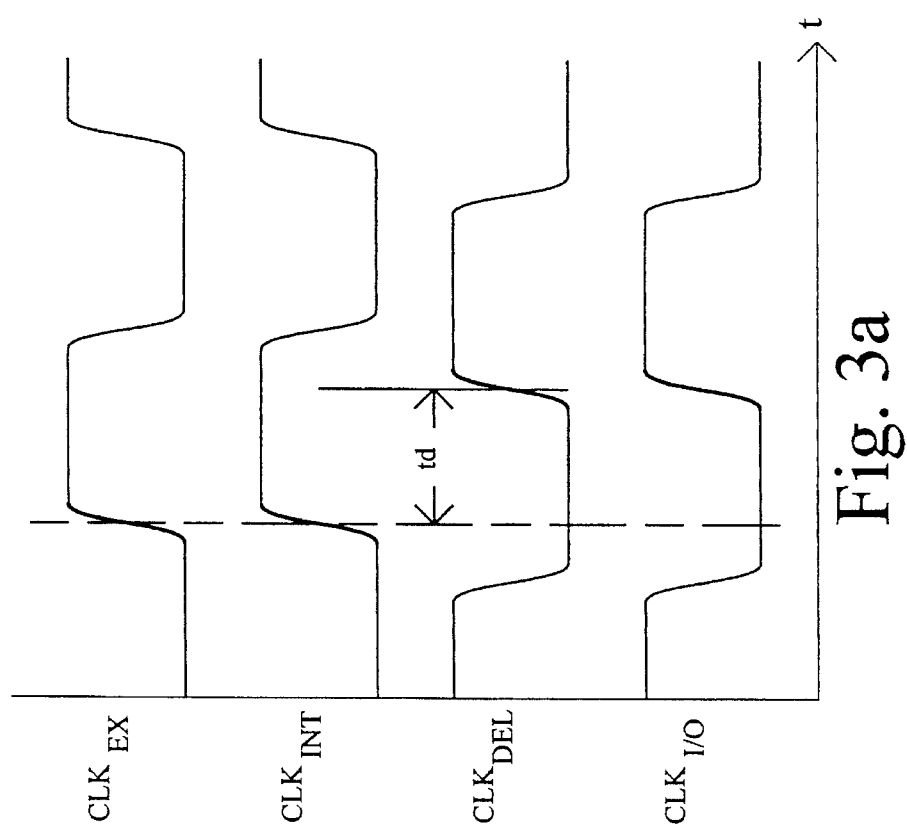
FIG. 3a is a timing diagram illustrating the clock signals of an embodiment of the present invention before phase correction.

FIGS. 3a and 3b are timing diagrams illustrating signals $CLK_{EX}$, $CLK_{INT}$, $CLK_{DEL}$, as well as $CLK_{I/O}$. FIG. 3a illustrates the initial state of the clock signals while FIG. 3b illustrates the clock signals as corrected by the phase correction subcircuit 134. As set forth in FIG. 3a, initially, $CLK_{INT}$ is synchronous with $CLK_{EX}$, while $CLK_{DEL}$ and $CLK_{I/O}$ lag $CLK_{EX}$ by an amount td. As represented by FIG. 3b the phase correction subcircuit 134 functions as a modified PLL that, when in "lock", phase shifts $CLK_{INT}$ forward by t1 which is approximately equal to td. Accordingly, $CLK_{DEL}$ and $CLK_{I/O}$ are phase shifted forward so as to be synchronous with $CLK_{EX}$.

Figure 4:
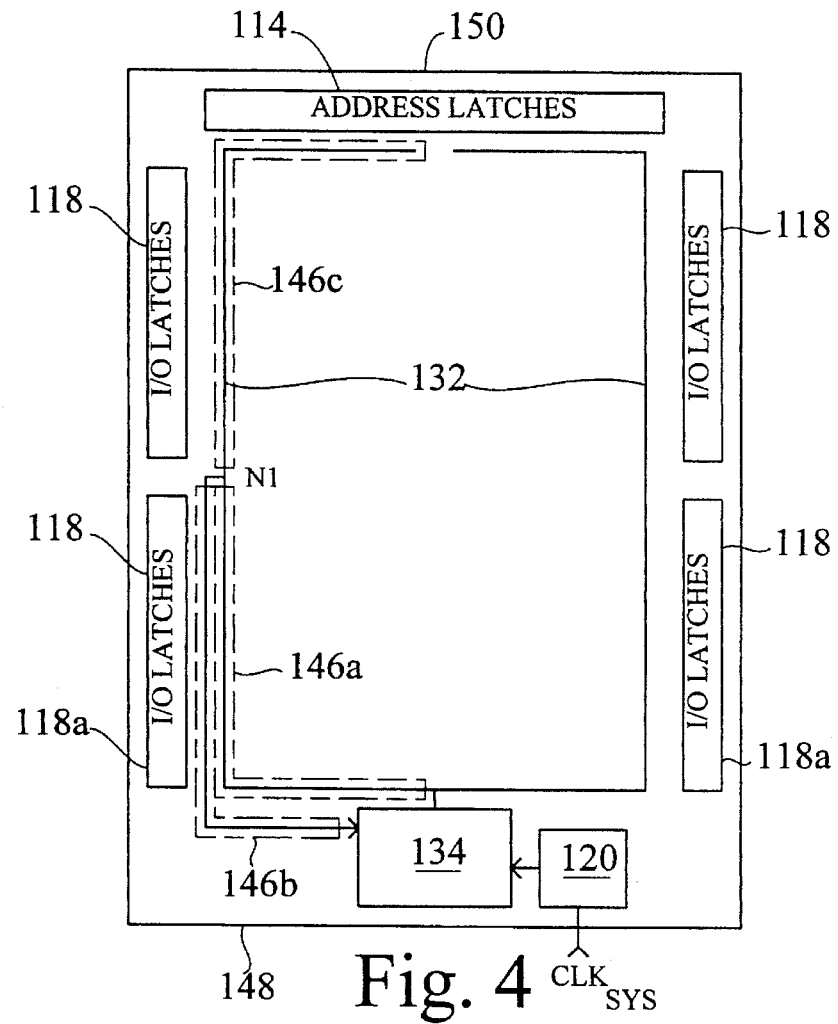
FIG. 4 is top plan view illustrating the layout of an embodiment of the present invention.

FIG. 4 is a top plan view illustrating the layout of one embodiment of the present invention. It is understood that the proportions are exaggerated for explanatory purposes. As shown in the figure the synchronous SRAM 110 is fabricated on a semiconductor "chip" that includes a first side 148 and an opposing second side 150. The clock buffer circuit 120 and phase correction subcircuit 134 are situated on the first side 148, while the clock routing subcircuit extends from the phase correction subcircuit 134, across the chip, to the second side 150. The clock routing subcircuit 132 is generally symmetrical and provides the internal clock signal to four I/O latch circuits 118 as well as address latch circuits 114.

Delay element 146a is shown to be the long-distance interconnect between the phase correction subcircuit 134 and node N1. Delay element 146b is shown to be a feedback interconnect from N1 back to the phase correction subcircuit 134. Delay element 146c is the section of long-distance interconnect stretching from node N1 to where the clock routing subcircuit 132 terminates at the address latch circuit 114. As mentioned previously, delay element 146b is designed to have the same approximate clock signal response as that of delay element 146c. In the embodiment illustrated in FIG. 5, this is accomplished by delay element the 146b being composed of the same fabrication elements as delay element 146c. Both delay elements (146b and 146c) are fabricated from the same metallization layer, have the same line width, and are routed the same manner, i.e. over the same underlying material (in the preferred embodiment an interlayer dielectric and field oxide). Parasitic capacitance between the long-distance interconnects is minimized by providing sufficient layout distance between the two lines. However, one skilled in the art would recognize that the interconnects could be closer in proximity with the resulting parasitic capacitance compensated for by moving the position of node N1 accordingly.

Referring once again to FIG. 4 it is shown that a number of I/O latch circuits 118 and address latch circuits 114 are situated along the clock routing subcircuit 132. As a result, the delay induced by the clock routing subcircuit 132 grows in proportion to the distance between the latch circuit (118 or 114) and the clock input. For example, the phase lag experienced by the I/O latch circuits 118 closest to the phase correction subcircuit 134, are much smaller than that experienced by the address latch circuits 114. If these differences are severe enough, it is possible to overcompensate for clock delay with phase correction subcircuit 134. This can occur when $CLK_{INT}$ leads $CLK_{EX}$ by such an amount that clocked circuits closest to the phase correction subcircuit 134 are clocked too early, resulting in timing errors. For example, the I/O latch circuits 118a closest to the phase correction circuit 134 could latch before the correct data are provided by decoder operation. Accordingly, proper timing margins for clocked circuits should be observed in establishing the value of the delay elements 146.

Figure 5:
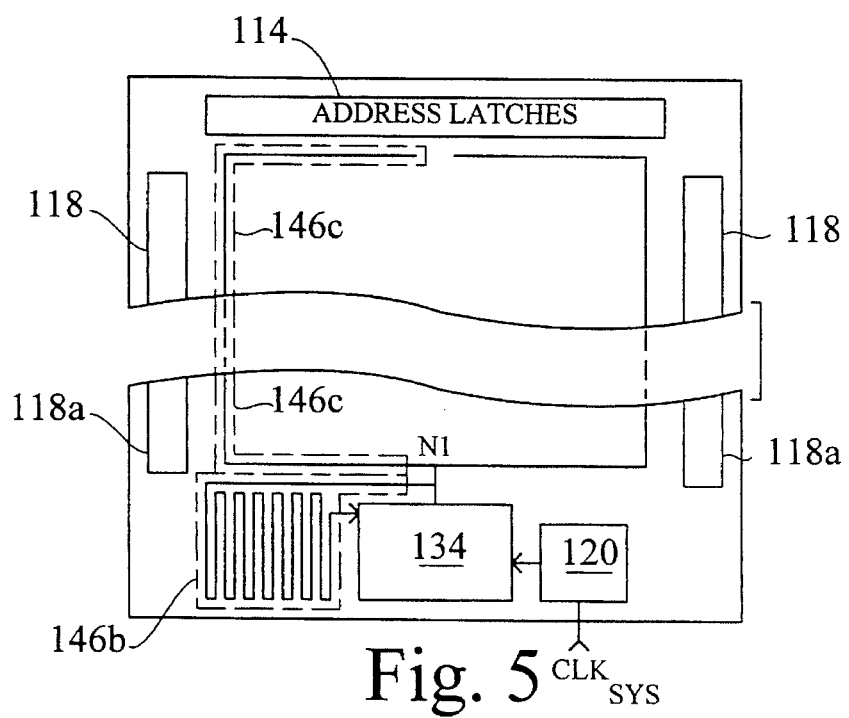
FIG. 5 is a top plan view illustrating an alternate embodiment of the present invention.

An alternate embodiment of the present invention is set forth in FIG. 5 which is a partial top plan view of a synchronous SRAM 110. The alternate embodiment has a similar configuration to that of the embodiment set forth in FIG. 4, and to that extent, identical items to those appearing in the FIG. 4 will be referred to by the same general reference number.

Referring once again to FIG. 2, the embodiment of FIG. 5 illustrates the alternate embodiment wherein the first delay element 146a is eliminated (its effect on the clock signal is negligible) by moving node N1 to the output of the phase correction subcircuit 134. In this configuration the second delay element 146b functions as a single feedback element. As shown in FIG. 5, in the alternate embodiment, the feedback element 146b includes a "snake" pattern of interconnect having the equivalent resistance and capacitance as delay element 146c. Unlike the example of FIG. 4, delay element 146c is now the long-distance interconnect extending from the output of the phase correction subcircuit 134 to the opposing second side 150 of the synchronous SRAM 110.

While the embodiments of FIGS. 4 and 5 both illustrate synchronous SRAMs 110 in which the same modified clock ($CLK_{INT}$) is distributed to a number of clocked circuits, it is understood that the phase correction subcircuit 134 could be used to apply a modified (phase shifted forward) clock signal to only those clocked circuits experiencing the greatest delay/skew (in FIG. 2, the latching circuits toward the second side 150 of the chip). A conventional clock routing circuit using the $CLK_{EX}$ signal could be used to provide a clock to the remaining clocked circuits. Alternatively, for clocked circuits that receive a $CLK_{INT}$ signal that is phase shifted too far forward, delay elements could be introduced to correct the timing.

As will be apparent to one skilled in the art, the invention has been described in connection with its preferred embodiments, and may be changed, and other embodiments derived, without departing from the spirit and scope of the invention. Accordingly, the scope of the claimed invention is better defined with reference to the following claims.

What we claim is:

1. A semiconductor memory device, comprising:

at least one memory array having a plurality of memory cells;

at least one clocked circuit responsive to an internal clock signal, said clocked circuit having a clock signal input;

a clock distribution circuit having a plurality of signal paths for providing the internal clock signal to said clocked circuit; and a modified phase locked loop circuit (PLL) having an output coupled to said clock distribution circuit, said modified PLL generating an internal clock signal at the output in response to an external clock signal and a delayed internal clock signal, the delayed internal clock signal being the internal clock signal coupled to said modified PLL by a delay feedback path.

2. The memory device of claim 1 wherein:

said clock distribution circuit includes a feedback node, and a first propagation path, the first propagation path being the portion of the clock distribution circuit intermediate the feedback node and said clocked circuit; and the delay feedback path of said modified PLL is a conductive path from the feedback node in said clock distribution circuit to said modified PLL, the clock signal delay/skew response of the first propagation path being generally the same as the clock signal delay/skew response of the conductive path.

3. The memory device of claim 2 wherein:

the conductive path and the first propagation path are constructed of like fabrication layers.

4. The memory device of claim 3 wherein:

the memory device includes a substrate; and the fabrication layers include a metallization layer, and at least one dielectric layer intermediate the fabrication layer and said substrate.

5. The memory device of claim 2 wherein:

the conductive path and the first propagation path have equivalent capacitance values.

6. The memory device of claim 2 wherein:

the conductive path and the first propagation path have equivalent resistance and capacitance product (RC) values.

7. The memory device of claim 2 wherein:

the first propagation path includes a plurality of inverters having a first total delay and the delay feedback path includes a second plurality of inverters having a second total delay equivalent to the first total delay.

8. The memory device of claim 2 wherein:

the feedback node is situated midway between the modified PLL and said clocked circuit.

9. The memory device of claim 1 wherein:

a second propagation path is a portion of the clock distribution circuit intermediate the output of said modified PLL and said clocked circuit; and said modified PLL includes a first input for receiving the external clock signal and a second input for receiving the delayed internal clock signal, and the delay feedback path is proximate the modified PLL intermediate the output and the second input.

10. The memory device of claim 9 wherein:

the delay feedback path and the second propagation path have equivalent capacitance values.

11. The memory device of claim 9 wherein:

the delay feedback path and the second propagation path have equivalent resistance and capacitance product (RC) values.

12. The memory device of claim 9 wherein:

the second propagation path includes a plurality of inverters having a first total delay and the delay feedback path includes a second plurality of inverters having a second total delay equivalent to the first total delay.

13. The memory device of claim 1 wherein:

the memory device is disposed on a semiconductor die, said die having a first end and a second end;

said memory array is centrally disposed within said die;

said clocked circuit is disposed proximate the second end;

said modified PLL is disposed proximate the first end; and said clock distribution circuit extends intermediate said modified PLL and said clocked circuit.

14. The memory device of claim 13 further including:

an external clock buffer for receiving the external clock and providing the external clock to clocked circuits of the memory device;

a first clocked circuit proximate the first end;

said clocked circuit proximate the second end is a second clocked circuit; and said clock distribution circuit includes a system portion and a phase shift portion, the system portion distributing the external clock to at least the first clocked circuit, the phase shift portion distributing the internal clock from said modified PLL to at least the second clocked circuit.

15. The memory device of claim 13 further including:

a first clocked circuit proximate the first end;

said clocked circuit proximate the second end is a second clocked circuit; and said clock distribution circuit includes delay means for delaying the internal clock signal prior to being applied to at least the second clocked circuit.

16. The memory device of claim 1 wherein:

said modified PLL includes a phase comparator for receiving the external clock signal and the delayed internal clock signal, a charge pump for receiving a phase error signal from the phase detector, a loop filter coupled to the output of the charge pump, the loop filter providing an error voltage, and a voltage controlled oscillator (VCO) for providing the internal clock signal in response to the error voltage.

17. The memory device of claim 16 wherein:

the phase comparator is a sequential phase comparator.

18. The memory device of claim 17 wherein:

the VCO has a free running frequency equivalent to the system clock.

\* \* \* \* \*